US006756787B2

(12) United States Patent
Ohlhoff et al.

(10) Patent No.: US 6,756,787 B2
(45) Date of Patent: Jun. 29, 2004

(54) INTEGRATED CIRCUIT HAVING A CURRENT MEASURING UNIT

(75) Inventors: Carsten Ohlhoff, München (DE); Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/243,067

(22) Filed: Sep. 13, 2002

(65) Prior Publication Data

US 2003/0057987 A1 Mar. 27, 2003

(30) Foreign Application Priority Data

Sep. 13, 2001 (DE) ......................................... 101 45 021

(51) Int. Cl.[7] .............................................. H01H 31/02
(52) U.S. Cl. ....................... 324/537; 324/763; 324/765; 324/158.1

(58) Field of Search ................................. 324/537, 761, 324/763, 765, 768, 769, 158.1, 600, 713, 719; 327/54, 66

(56) References Cited

U.S. PATENT DOCUMENTS

| 5,332,973 A | 7/1994 | Brown et al. ............... 324/537 |
| 6,342,790 B1 * | 1/2002 | Ferguson et al. ........... 324/765 |

* cited by examiner

*Primary Examiner*—N. Le
*Assistant Examiner*—Vincent Q. Nguyen
(74) *Attorney, Agent, or Firm*—Laurence A. Greenberg; Werner H. Stemer; Gregory L. Mayback

(57) ABSTRACT

The invention relates to an integrated circuit having a circuit and a current measuring unit for measuring the current through the functional circuit. The current measuring unit is connected to an output device in order to output the value of the measured current to an external test system via an external connection of the integrated circuit.

9 Claims, 3 Drawing Sheets

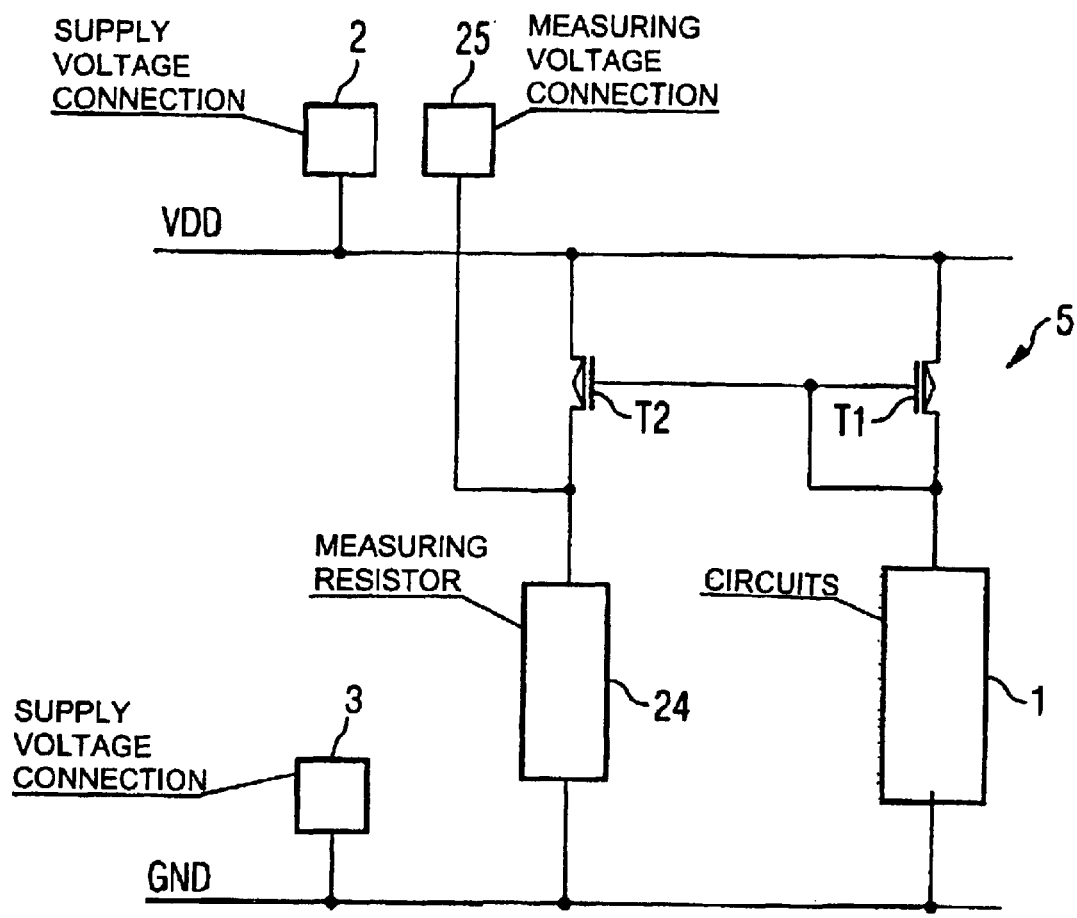

INTEGRATED CIRCUIT HAVING A CURRENT MEASURING UNIT

BACKGROUND OF THE INVENTION

FIELD OF THE INVENTION

The invention relates to an integrated circuit having circuits that will be tested by an external test system, and to an external test system.

As a result of increasing complexity, testing integrated circuits is becoming more and more time-consuming. This leads to higher costs, and as a rule, reduces the throughput in the fabrication of integrated circuits. In order to reduce the test costs or to increase the throughput, it is necessary, for example, to increase the parallelism during testing. One further possibility is to reduce the requirements placed on the external test systems, in order in this way to reduce the test duration and therefore the costs.

For instance, a self-test (BIST=build-in self-test) is performed, during which the integrated circuits are tested by suitable additional circuits that are actually configured on the integrated circuit that will be tested.

Integrated circuits can exhibit an increased current consumption because of defects such as short circuits or within the context of process fluctuations in fabrication. In order to identify corresponding chips, it is necessary to measure a current flow through the entire integrated circuit or parts thereof during the production test. This current measurement has hitherto been carried out by a DC measurement unit. For this purpose, an appropriately equipped external test system is required which, during the parallel testing, needs a separate measuring unit for each of the integrated circuits that will be tested.

SUMMARY OF THE INVENTION

It is accordingly an object of the invention to provide an integrated circuit in which the current consumption can be measured more quickly during testing and in which lower requirements are placed on the external test system. It is furthermore an object of the present invention to provide a method for measuring current in such an integrated circuit.

With the foregoing and other objects in view there is provided, in accordance with the invention, an integrated circuit, including: a circuit having a current flowing therein; an external connection; and a current measuring unit for obtaining a measured current representing the current flowing in the circuit. The current measuring unit includes an output device for outputting a value of the measured current to an external test system via the external connection. The current measuring unit includes a measurement current path. The current measuring unit includes a current measuring circuit. The current measuring unit includes a current mirror circuit for obtaining a mirrored current by mirroring the current flowing in the circuit into the measurement current path. The measurement current path is led through the current measuring circuit so that the measured current can be obtained by measuring the mirrored current and so that the value of the measured current can be output by the output device. The current measuring circuit includes a capacitor. The current measuring circuit includes a switching device for charging the capacitor from a low voltage value to a high voltage value by using the mirrored current and for reversing a polarity of the capacitor when a voltage value stored in the capacitor exceeds the high voltage value. A number of charging operations of the capacitor occurring during a predetermined time period depend in an unambiguous way on the mirrored current.

In accordance with an added feature of the invention, the current measuring circuit has a counter device designed to measure the number of the charging operations of the capacitor occurring during the predefined time period; and the counter device outputs the number of the charging operations via the output device.

In accordance with an additional feature of the invention, there is provided, a second current measuring circuit including a second switching device, a second capacitor, and a second counter device. The second current measuring circuit obtains a predetermined current. The second capacitor is charged by the predetermined current for a predetermined number of recharging operations of the second capacitor. The second counter device is connected to the first current measuring circuit for starting the first counter device to begin counting the predetermined number of charging operations of the second capacitor and for stopping the first counter device after the predetermined number of recharging operations of the second capacitor has been reached.

In accordance with another feature of the invention, the output device is configured to serially transmit the value of the measured current to the external test system.

In accordance with a further feature of the invention, the integrated circuit includes a DRAM memory circuit.

In accordance with a further added feature of the invention, the current measuring circuit has a capacitor that can substantially be charged up via the mirrored current.

In accordance with another added feature of the invention, the output device is configured to output the measured value as a digital value.

With the foregoing and other objects in view there is provided, in accordance with the invention, a method of measuring a current in a circuit in an integrated circuit. The method includes steps of: providing the integrated circuit with a current measuring unit including a current mirror circuit for mirroring the current in the circuit into a measurement current path; providing the current measuring unit with an output unit to output a measured value of a measured current via an external connection; providing a voltage to the integrated circuit which lies a predetermined amount above a nominal supply voltage of the integrated circuit, the predetermined amount corresponding to a voltage drop across a transistor in the integrated circuit; and obtaining the measured value in dependence on a current consumption of the circuit.

In accordance with an added mode of the invention, the method includes steps of: outputting a reference current to the integrated circuit; and determining the measured value by using the reference current and outputting the measured value with the output device.

According to the invention, an integrated circuit is provided with a circuit that has a current measuring unit. The current measuring unit is used to measure the current through the circuit, and the current measuring unit is connected to an output device. The output device is configured in such a way that the value of the measured current can be output to an external test system via an external connection of the integrated circuit.

According to the invention, therefore, the current measuring unit is provided within the integrated circuit instead of, as had customarily been the case, providing the current measuring unit outside the integrated circuit, for example, in the external test system or connected to the external test system. In this way, the current through the circuits of the integrated circuit can be measured at any time, so that during the parallel testing of a plurality of integrated circuits, the current through the circuits of each of the integrated circuits can be measured substantially simultaneously in each case and can subsequently be transmitted to an external test system, for example. This therefore avoids the necessity of providing an additional current measuring unit outside the integrated circuit, in which the current measurements would have to be carried out sequentially if a sufficient number of external current measuring devices are not available.

Since it is frequently customary to provide integrated circuits with a BIST circuit, a data output used by the BIST circuit can also be used to output the current value.

A further advantage resides in the fact that, during the current measurement, a common voltage source can be used for a plurality of integrated circuits that will be tested in parallel. Individual voltage sources for an external current measuring unit in each case are therefore not necessary.

Provision can preferably be made for the output device to be configured to transmit the value of the measured current serially to an external test system. This has the advantage that the current value can be output via only one output connection, so that the remaining connections continue to be available for testing the functionality of the circuit. That is to say, the current is measured during a functional test of the circuit, and the corresponding current value is read out during the testing of the functional circuits.

The circuits of the integrated circuit can include a memory circuit. In particular in the case of memory circuits, the current flow is a significant variable that determines the quality and classification of the memory circuit, in particular in the case of DRAM modules. Since the value of the current must not exceed a specific amount and depends on the operating frequency, the maximum permissible current, in addition to other influencing variables, determines the maximum operating frequency of the memory module. In this case, the maximum operating frequency is often used as a classification feature, and chips with an increased current consumption are sorted out with regard to the specification.

The current measuring unit preferably has a current measuring circuit and a current mirror circuit, in order to mirror the current through the circuit into a measurement current path. The measurement current path is led through a current measuring circuit, in order to measure the mirrored current and to output the value of the measured current via the output device. In this way, the current measuring unit only influences the circuit to a low extent, so that the current that flows through the circuit can be measured exactly.

Additionally, the current measuring circuit can have a switching device with a capacitor, in order to charge up the capacitor from a low voltage value to a high voltage value using the current and in order to reverse the polarity of the capacitor when the voltage value stored in the capacitor exceeds the high voltage value. A number of charging operations of the capacitor occurring during a predetermined time period depend on the current. In this way, a current measuring circuit can be implemented which measures the current as a number of charging operations. This has the advantage that such a switching device can be implemented in a particularly simple way in an integrated circuit. Furthermore, using the switching device, the value of the current that is measured can be digitized in a particularly simple way.

Furthermore, the current measuring circuit can have a counter device that is designed to measure the number of charging operations of the capacitor during a predefined time period and to output the measured number of charging operations via the output device. In this way, the value of the current that is measured can be averaged during the predefined time period, so that an average current flow is measured, in which short-term disruption, for example, interference pulses, remains unnoticed.

Furthermore, the integrated circuit can have a second current measuring circuit that includes a second switching device with a second capacitor and a second counter device. In this case, a predetermined current, which is provided, for example, by the external test system, is applied to the second current measuring circuit. The second capacitor can be charged up by the predetermined current for a predetermined second number of charging operations. The second counter device is configured in such a way that, at the start of counting the predetermined second number of charging operations in the second capacitor, the second counter device starts the predefined time period in the first counter device, and after reaching the predetermined second number of charging operations of the second capacitor, the second counter device stops the predefined time period in the first counter device. The second counter device therefore counts a predefined number of charging operations by using a current of known magnitude, which is externally applied, for example. The starting and reaching of the final value of this second counter device are used to define the time during which the first counter determines the number of charging operations by the current that is measured. In this way, the absolute value of the current that is measured through the circuit can be determined, and only the following parameters have to be known: the current through the second current measuring circuit, which is predetermined by the external test system for example, the ratio of the first capacitance to the second capacitance, and also the predetermined second number of charging operations. Therefore, only the capacitance ratio is needed as a component parameter.

According to a further aspect of the present invention, an external test system for measuring a current in an integrated circuit can be provided. The external test system is configured in order to output a voltage to the integrated circuit. The voltage is a predetermined amount above the nominal supply voltage of the integrated circuit. The external test system is also configured to receive a measured value that depends on the current consumption of the integrated circuit.

Providing a circuit for measuring a current in an integrated circuit means that the external test system does not have to carry out its own current measurement, but merely receives the measured value that indicates the current consumption of the circuit. The external test system can therefore receive the corresponding measured values in parallel, and does not have to carry out a measurement one after another during parallel testing. If the measured value is transmitted as a digital value, it is possible to dispense with analog measuring devices in the external test system. Furthermore, provision can be made for the external test system to output a reference current, and it is possible for the current that is measured to be determined using the reference current, the predetermined second number of recharging operations, the capacitance ratio of the first capacitor to the second capacitor and the first number of recharging operations that correspond to the measured value.

The magnitude of the externally applied voltage is advantageously chosen in such a way that a voltage drop across the current mirror circuit is compensated for and the circuit is supplied with the nominal voltage.

Other features which are considered as characteristic for the invention are set forth in the appended claims.

Although the invention is illustrated and described herein as embodied in a integrated circuit having a current measuring unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 shows a third embodiment of an integrated circuit having a current measuring unit.

DESCRIPTION OF THE PREFERRED EMBODIMENTS

Figure 1:
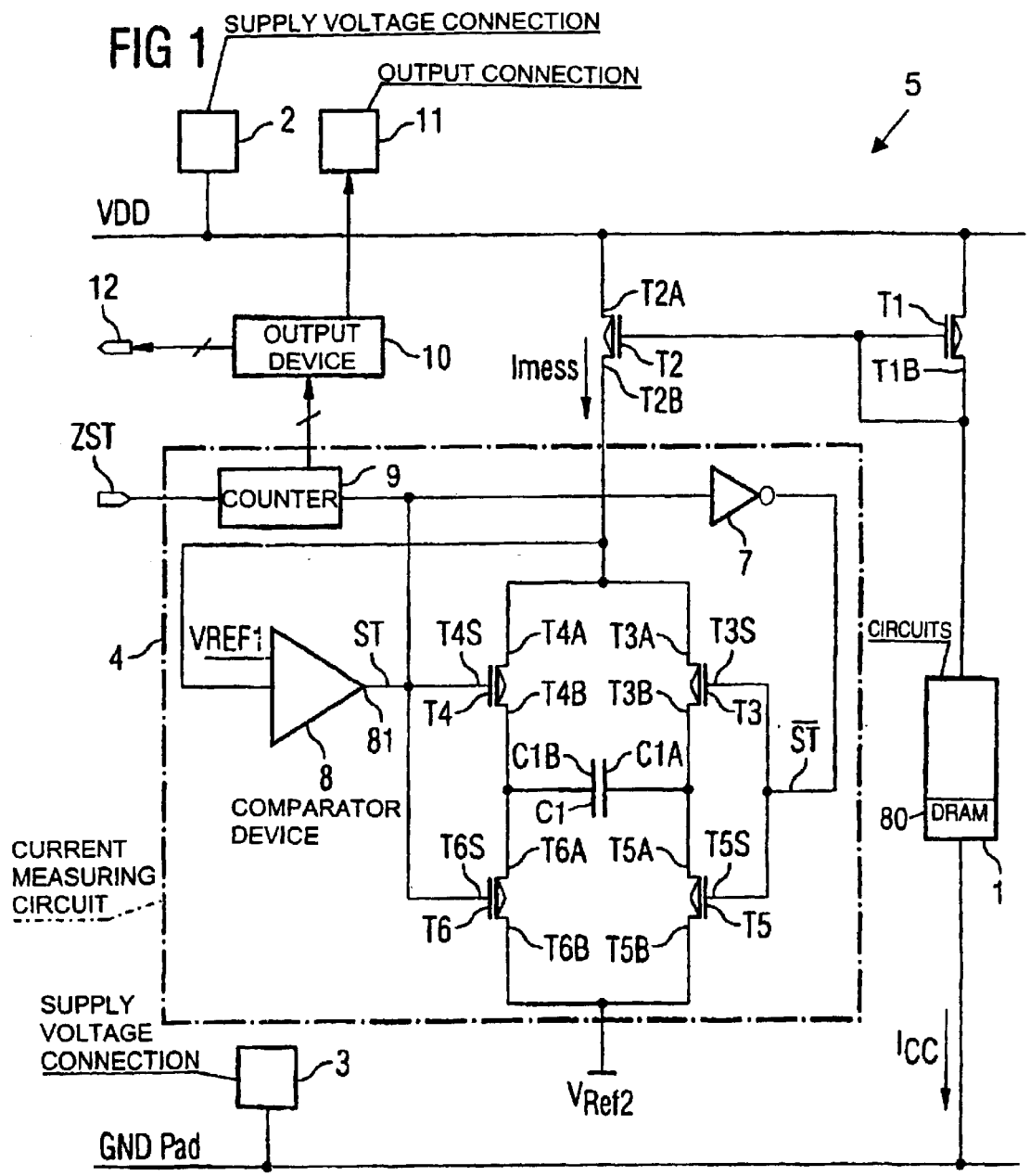
FIG. 1 shows a first embodiment of an integrated circuit having a current measuring unit.

Referring now to the figures of the drawing in detail and first, particularly, to FIG. 1 thereof, there is shown an integrated circuit having functional circuits 1 that are supplied with an operating voltage via a first supply voltage connection 2 and a second supply voltage connection 3. The functional circuits 1 may be logic circuits that determine the function of the integrated circuit. Furthermore, they can include memory circuits, for example, DRAM (Dynamic Random Access Memory) memory circuits 80. A first supply voltage level VDD is applied to the first supply voltage connection 2, and a second supply voltage level, which preferably has a ground potential GND, is applied to the second supply voltage connection 3.

A current mirror circuit 5, having a first transistor T1 and a second transistor T2, is arranged between the first supply voltage connection 2 and the circuits 1. The first transistor T1 and the second transistor T2 are substantially identical. The current mirror circuit 5 is connected in such a way that the current Icc through the transistor T1 is mirrored into the transistor T2. A source terminal of the first transistor T1 is connected to the first supply voltage connection 2. A drain terminal of the first transistor T1 is connected to the circuit 1. The drain terminal of the transistor T1 is connected to the gate input of the first transistor T1 and the gate input of the second transistor T2. The transistor T2 is connected to the first supply voltage connection 2 by a source terminal T2A. A drain terminal T2B of the second transistor T2 is connected to a current measuring circuit 4.

In this way, the current mirror circuit 5 can mirror the current through the circuits 1 into the current path formed by T2 and the current measuring circuit 4. In this case, the second transistor T2 is driven by the voltage applied to the drain terminal T1B of the first transistor T1 in such a way that—assuming identical design and parameters—it is in the same operating state as the first transistor T1, and the mirrored current Imess that will be measured flows through the second transistor T2 and the current measuring circuit 4.

The current measuring circuit 4 has a capacitor C1 which is wired in such a way as to charge up the capacitor C1 continuously from a low voltage level Vref2 to a high voltage level Vref1 using the mirrored current that is measured Imess. The high voltage level VREF1 and the low voltage level VREF2 are provided by constant voltage sources (not shown), which are either generated in the integrated circuit itself or provided via external connections. The low voltage level Vref2 is preferably chosen such that the voltage level lies between the value of the high voltage level Vref1 and a ground potential GND on the second supply voltage connection 3. Of course, it is also possible for the low voltage level Vref2 to be at ground potential GND. The voltage difference between the high voltage level Vref1 and the low voltage level Vref2 is preferably chosen to be as small as possible in order that the capacitor C1 can be operated over a relatively small voltage range, in which the capacitor C1 is linear.

The capacitor C1 is wired in such a way that, depending on a control signal ST, the capacitor C1 charges up to the high voltage level VREF1 either by a transistor T4 or a transistor T3. The third transistor T3 and the fourth transistor T4 are preferably constructed as p-channel field effect transistors. The source terminal T3A of the third transistor T3 and the source terminal T4A of the fourth transistor T4 are each connected to the drain terminal T2B of the second transistor T2. A gate input T4S of the fourth transistor T4 is connected to the control signal ST, and a gate input T3S of the third transistor T3 is connected to the control signal $\overline{ST}$ inverted by an inverter 7. A drain terminal T3B of the third transistor T3 is connected to a first terminal C1A of the capacitor C1, and the drain terminal T4B of the fourth transistor T4 is connected to a second terminal C1B of the capacitor C1.

The first terminal C1A of the capacitor C1 and the drain terminal T3B of the third transistor T3 are connected to a drain terminal T5A of the fifth transistor T5. The second terminal C1B of the capacitor C1 and the drain terminal T4B of the fourth transistor T4 are connected to a drain terminal T6A of the sixth transistor T6. The fifth transistor T5 and the sixth transistor T6 are preferably constructed as n-channel field effect transistors. The source terminals T5B, T6B of the fifth transistor T5 and of the sixth transistor T6 are each connected to the low voltage level VREF2. The low voltage potential VREF2 can either be provided additionally, or for example, can be connected via the second supply voltage connection 3 to the ground potential GND. The gate terminal T6S of the sixth transistor T6 is connected to the control signal ST, and the gate terminal T5S of the fifth transistor T5 is connected to the control signal $\overline{ST}$, which is obtained by the inverter 7 inverting the control signal ST.

The control signal ST therefore switches on either the fourth transistor and the fifth transistor or the third transistor T3 and the sixth transistor T6. When this change over is performed by the control signal ST or the inverted control signal $\overline{ST}$, therefore, the inter-connected capacitor C1 has its polarity reversed with respect to the current Imess, so that the charge on the capacitor C1 is supplied in the opposite manner with charge from the current Imess.

The source terminals T3A, T4A of the third transistor T3 and of the fourth transistor T4 are connected to a comparator device 8. The first reference voltage VREF1 is applied to the comparator device 8 via an input. The comparator device 8 is connected in such a way that the control signal changes over, that is to say from a logic "0" to a logic "1" or vice versa when the high voltage level VREF1 is exceeded.

In this way, the state of the control signal ST changes every time the voltage on the source terminals T3A, T4A of the third transistor T3 and of the fourth transistor T4 exceeds the high voltage level VREF1. Upon a change in the state signal ST, the capacitor C1 has its polarity reversed, so that substantially the voltage potential of the low voltage level VREF2 is applied to the comparator device 8. Starting from the low voltage level VREF2, the capacitor is then charged up to the high voltage level VREF1 because of the current that is measured Imess. Once the high voltage level VREF1 has been reached, the comparator device 8 switches over again and changes the state of the control signal ST. The speed at which the charging operations take place depends on the current that is measured Imess, since the voltage in the capacitor C1 rises more quickly, the greater the mirrored current that is measured Imess.

The output of the comparator device 8, on which the control signal ST is present, is also connected to a counter device 9. The counter device 9 counts the charging operations in a predefined time period and forwards their number N from the counter reading to an output device 10.

The output device 10 is connected to an external output connection 11, via which the counter value can be output to an external test system. The predefined time period during which the test charging operations are counted is determined by a counter control signal ZST. The counter device 9 is switched on by a first edge of the counter control signal ST, and the counter device 9 is switched off by the next edge, so that the predetermined time period corresponds to the time period between the first and the second edge of the counter control signal ZST. The counter control signal ZST can be defined in the integrated circuit, but it can also be adjusted variably, for example, by the externally connected test system. Short-term changes in the current that is measured Imess which are shorter than the predetermined time period of the measurement then do not have a substantial influence during the measurement of the current Imess, since the current Imess is averaged over the predetermined time period.

Furthermore, the output device 10 can also process the measured value further within the integrated circuit so that, for example, power control of the functional circuits may be possible. For this purpose, a further connection 12 is provided, via which the counter value is made available to further circuits of the integrated circuit.

Using the integrated circuit shown in FIG. 1, it is possible to carry out the current measurement within the integrated circuit. The value of the current Imess that will be measured is determined by a counter reading in the counter device 9 and is output to an external test system (not shown) during testing. In this way, it is possible to use an external test system in which it is not necessary to provide any current measuring unit for measuring the current in the integrated circuits that are tested. In addition, the currents flowing in a plurality of integrated circuits can be measured simultaneously in this way, and the corresponding measured values of the current can be transmitted to the connected external test system.

In order to determine the current as exactly as possible, provision can be made for a voltage to be applied to the first supply voltage connection 2 which is higher by a specific amount than the supply voltage that is usual for the circuit 1. The differential voltage between the first supply voltage level VDD on the supply voltage connection 2 and the normal operating voltage of the circuits 1 is chosen such that it corresponds to the voltage drop across the first transistor T1. In this way, a voltage identical to the usual supply voltage is present on the circuit 1. An erroneous measurement, which would result from a reduced operating voltage on the functional circuits 1, is therefore ruled out.

For the production test of the integrated circuit, it is important to measure the standby current. The standby current is subjected to an extremely wide distribution as a result of production-induced process fluctuations and statistical defects. All the further load currents may be represented in practice as the sum of the standby current and a substantially design-dependent component. Standby currents are typically of the order of magnitude of less than 100 µA or a few milliamperes. In order to reduce the current in standby operation, a large proportion of the generators is switched off in typical semiconductor chips. In this case, because of the low current consumption in standby operation, the supply of voltage to the integrated circuit via only one supply voltage connection during the current measurement is possible. During a current measurement as described, the further supply voltage connections which are otherwise normal should not have contact made from outside or should be isolated from the internal current distribution network in which the current is measured.

When the current measuring circuit shown in FIG. 1 is used, the current Imess may be determined here by the following formula:

$$Imess = \frac{Q}{T} = 2 \cdot C \cdot dU \cdot N / T,$$

where dU=VREF1−VREF2 or dU=Vref1, if VREF2 is connected to ground potential GND, N is the measured number of charge changes in the counter device 9, T is the predefined measurement time period, and C is the capacitance.

While constant voltage sources can be adjusted very exactly in integrated circuits, it is often difficult to define the absolute capacitance of a capacitor, because of process fluctuations.

Figure 2:
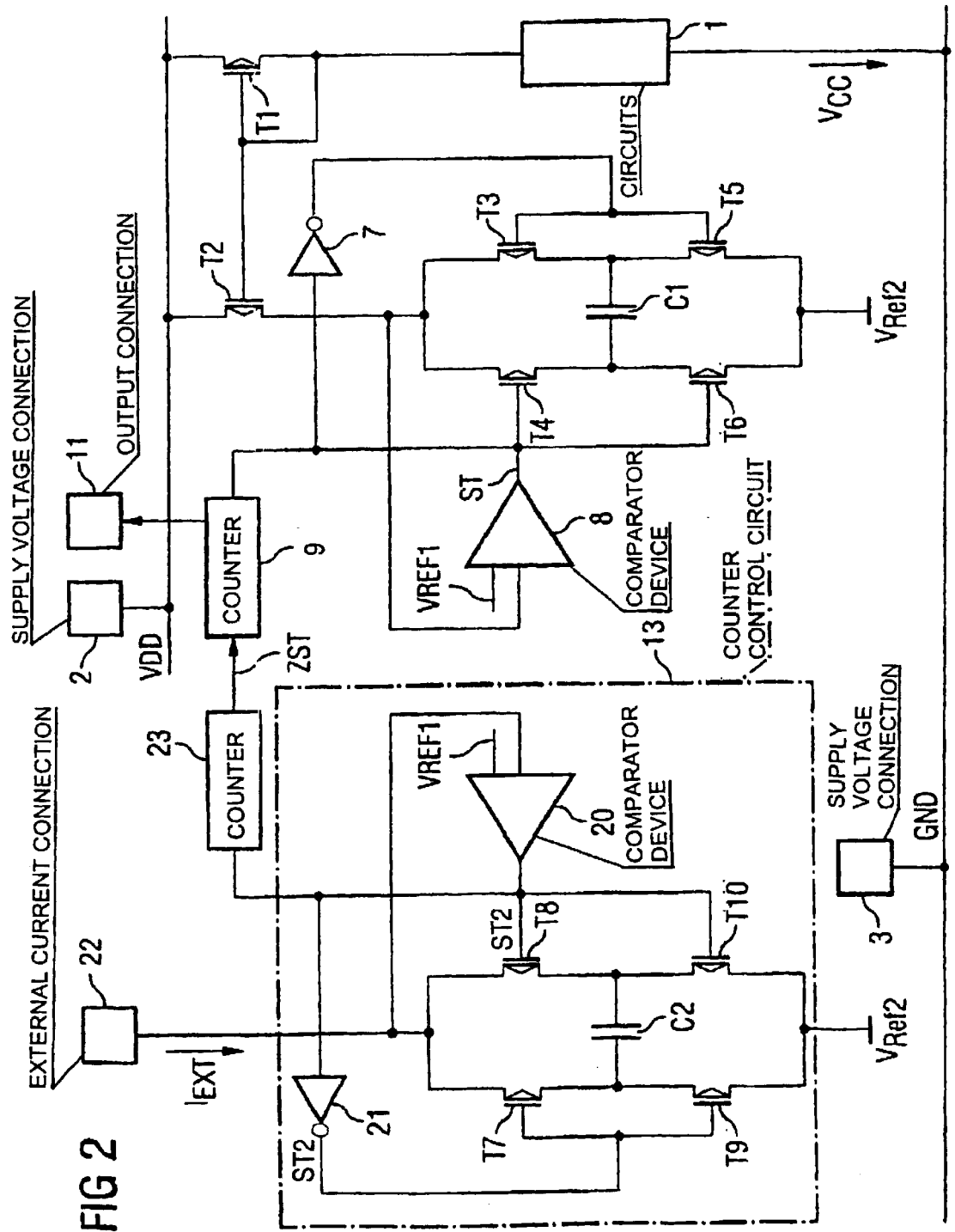
FIG. 2 shows a second embodiment of an integrated circuit having a current measuring unit.

This difficulty can be circumvented in the embodiment shown in FIG. 2. In FIG. 2, in addition to the current measuring circuit 4 already illustrated in FIG. 1, there is shown a counter control circuit 13 that can be used to generate the counter control signal ZST. The counter control circuit 13 is constructed substantially identically to the current measuring circuit 4. The difference is that instead of a capacitor C1, a second capacitor C2 is provided, whose capacitance has a constant ratio with respect to C1. The same designations designate the same or identical components or subassemblies.

The counter control circuit 13 is constructed as follows: A source terminal of an eighth transistor T8 and a source terminal of a seventh transistor T7 are connected to an external current connection 22. A drain terminal of the seventh transistor T7 is connected to a drain terminal of a ninth transistor T9. A drain terminal of the eighth transistor T8 is connected to a drain terminal of a tenth transistor T10. The source terminals of the ninth transistor T9 and of the tenth transistor T10 are connected, via the second supply voltage connection 3, to the second reference voltage potential Vref2 or to the second supply voltage potential GND. The drain terminal of the ninth transistor T9 is connected to a first terminal of the second capacitor C2, and a second terminal of the second capacitor C2 is connected to the drain terminal of the tenth transistor T10. A second control signal ST2 is present on the output of a second comparator device 20.

The output of the second comparator device 20 is connected to the gate terminals of the eighth transistor T8 and the tenth transistor T10. The gate terminal of the seventh transistor T7 and the gate terminal of the ninth transistor T9 are connected to the inverted second control signal $\overline{ST2}$ obtained from a further inverter 21. The output of the second comparator device 20 is connected to the gate terminals of the eighth transistor T8 and the tenth transistor T10. The output of the second comparator device 20 is likewise connected to a second counter device 23.

The second comparator device 20 also has an input for the reference voltage level Vref1. The second comparator device 20 operates in the same way as the first comparator device 8.

The counter control circuit 13 including the seventh, eighth, ninth and tenth transistor T7, T8, T9, T10 therefore has substantially identical characteristics to the switching device of the current measuring circuit 4. Likewise, the second comparator device 20 and the second inverter 21 are provided, which are substantially identical to the first comparator device 8 and the first inverter 7. In this way, apart from the second capacitor C2, a circuit identical to the current measuring circuit 4 is provided.

The counter control circuit 13 likewise constructed in this way has a constant current Iext impressed on it. The constant external current Iext is supplied to the integrated circuit via the external current connection 22. The current Iext is preferably generated with a predetermined value in the external test system and impressed into the integrated circuit.

A second counter device 23 is connected to the counter control circuit 13. As already described in conjunction with the current measuring circuit 4, the second counter device 23 counts the recharging operations of the second capacitor C2. In this case, the speed of the recharging operations is determined by the constant external current Iext, the second capacitor C2 and the voltage range formed by the first voltage level VREF1 and the second voltage level VREF2.

As opposed to the first counter device 9, the second counter device 23 is constructed in such a way that, at a first counter reading, a counter control signal ZST is generated in order to start the first counter device 9, and at a second counter reading of the second control device 23, a counter control signal is generated in order to stop the first counter device 9. In this way, by using the identically constructed current measuring circuit in conjunction with the constant external current Iext, the second capacitor C2, and the predefined voltage range, a predetermined time period is defined during which the first counter device 9 measures the number of recharging operations of the first capacitor C1.

Using the second current measuring circuit, therefore, via the fixedly predefined parameters, namely the external current Iext, the second capacitor C2 and the predetermined number N2 of recharging operations of the second capacitor C2, the predetermined time period T can be defined exactly by the following formula:

$$T = \frac{2 \cdot C2 \cdot dU \cdot N2}{Iext}$$

The current Imess that is measured is then given by:

$$Imess = \frac{C1}{C2} \cdot \frac{N}{N2} \cdot Iext.$$

It can be seen that, in this embodiment, it is not necessary to know or to determine the exact capacitance of the respective capacitors, instead it is sufficient to know the capacitance ratio between the first capacitor and the second capacitor $$\frac{C1}{C2}.$$

Since capacitance ratios in integrated circuits, as opposed to absolute capacitances, exhibit process-induced deviations only to a slight extent, it is possible to reduce the influence of process-dependent fluctuations in the capacitances. The current that is measured can then be determined exactly by using the capacitance ratio $$\frac{C1}{C2},$$

the measured number N of charging operations in the first counter device 9, the predetermined number N2 of charging operations in the second counter device 23, and the value of the external constant current Iext.

The number N2 of charging operations of the second capacitor C2, defined in the second counter device 23, can be chosen substantially as desired. For example, it can be set permanently in the integrated circuit or it can be transmitted to the integrated circuit by the external test system before the current measurement to be performed.

A further aspect of the present invention is shown in FIG. 3. There, a current mirror circuit 5 including the first and second transistors T1 and T2 is likewise provided, which mirrors the current through the circuits 1 into a further current path via the transistor T2. In the current path formed by T2 there is a measuring resistor 24. One terminal of the measuring resistor 24 is connected to the drain terminal of the second transistor T2. A second terminal of the measuring resistor 24 is connected to the second supply voltage connection GND. At the first terminal of the measuring resistor 24, a measuring voltage is made available to the external test system via a measuring voltage connection 25. The current flowing through the measuring resistor 24 substantially corresponds to the current through the circuits 1, so that the voltage on the measuring voltage connection 25 is proportional to the current through the circuits 1.

In this way, a current proportional to a voltage present on an external connection can be measured for the purpose of testing. In this exemplary embodiment, the circuits 1 connected to the current mirror 5 are also preferably supplied with a voltage which lies above the actual supply voltage of the circuits 1. In this way, a voltage drop across the transistor T1 is compensated for, so that substantially the supply voltage of the circuits which is usual during operation is present on the drain terminal of the first transistor T1.

The features of the invention disclosed in the preceding description, and in the drawings can be used, both individually and in any desired combination, for the implementation of the invention in its various embodiments.

We claim:

1. An integrated circuit, comprising:
   a circuit for conducting a current therein;
   an external connection; and
   a current measuring unit for obtaining a measured current representing the current in said circuit;
   said current measuring unit including an output device for outputting a value of the measured current to an external test system via said external connection;
   said current measuring unit including a measurement current path;
   said current measuring unit including a current measuring circuit;

said current measuring unit including a current mirror circuit for obtaining a mirrored current by mirroring the current in said circuit into said measurement current path;

said measurement current path being led through said current measuring circuit so that the measured current can be obtained by measuring the mirrored current and so that the value of the measured current can be output by said output device;

said current measuring circuit including a capacitor;

said current measuring circuit including a switching device for charging said capacitor from a low voltage value to a high voltage value by using the mirrored current and for reversing a polarity of said capacitor when a voltage value stored in said capacitor exceeds the high voltage value; and a number of charging operations of said capacitor occurring during a predetermined time period depending in an unambiguous way on the mirrored current.

2. The integrated circuit according to claim 1, wherein:

said current measuring circuit has a counter device designed to measure the number of the charging operations of said capacitor occurring during the predefined time period; and said counter device outputs the number of the charging operations via said output device.

3. The integrated circuit according to claim 1, comprising:

a second current measuring circuit including a second switching device, a second capacitor, and a second counter device;

said second current measuring circuit obtaining a predetermined current;

said second capacitor being charged by the predetermined current for a predetermined number of recharging operations of said second capacitor; and said second counter device connected to said first current measuring circuit for starting said first counter device to begin counting the predetermined number of charging operations of said second capacitor and for stopping said first counter device after the predetermined number of recharging operations of said second capacitor has been reached.

4. The integrated circuit according to claim 1, wherein:

said output device is configured to serially transmit the value of the measured current to the external test system.

5. The integrated circuit according to claim 1, comprising: a DRAM memory circuit.

6. The integrated circuit according to claim 1, wherein:

said current measuring circuit has a capacitor that can substantially be charged up via the mirrored current.

7. The integrated circuit according to claim 1, wherein:

said output device is configured to output the measured value as a digital value.

8. A current measuring method, which comprises:

providing an integrated circuit device with a circuit, a transistor connected to the circuit, and a current measuring unit including a current mirror circuit for mirroring the current in the circuit into a measurement current path and an output unit to output a measured value of a measured current via an external connection, providing a voltage to the integrated circuit device which lies a predetermined amount above a nominal supply voltage of the integrated circuit device, the predetermined amount substantially corresponding to a voltage drop across the transistor in the integrated circuit; and obtaining the measured value in dependence on a current consumption of the circuit.

9. The method according to claim 8, which comprises:

outputting a reference current to the integrated circuit; and determining the measured value by using the reference current and outputting the measured value with the output device.

\* \* \* \* \*